United States Patent
Horning et al.

(10) Patent No.: US 9,803,979 B2
(45) Date of Patent: Oct. 31, 2017

(54) SYSTEMS AND METHODS FOR A TIME-BASED OPTICAL PICKOFF FOR MEMS SENSORS

(71) Applicant: Honeywell International Inc., Morristown, NJ (US)

(72) Inventors: Robert D. Horning, Savage, MN (US); Grant Lodden, Minnetrista, MN (US)

(73) Assignee: Honeywell International Inc., Morris Plains, NJ (US)

( * ) Notice: Subject to any disclaimer, the term of this patent is extended or adjusted under 35 U.S.C. 154(b) by 31 days.

(21) Appl. No.: 14/860,443

(22) Filed: Sep. 21, 2015

(65) Prior Publication Data

US 2016/0377434 A1    Dec. 29, 2016

Related U.S. Application Data

(60) Provisional application No. 62/185,256, filed on Jun. 26, 2015.

(51) Int. Cl.
*G01C 19/00*    (2013.01)
*G01C 19/5726*    (2012.01)
(Continued)

(52) U.S. Cl.
CPC ..... *G01C 19/5726* (2013.01); *G01C 19/5621* (2013.01); *G01C 19/5656* (2013.01);
(Continued)

(58) Field of Classification Search
CPC .. G01C 19/5726; G01C 19/574; G01C 19/28; G01C 19/5719; G02B 6/29331;
(Continued)

(56) References Cited

U.S. PATENT DOCUMENTS 4,420,259 A * 12/1983 Taylor .................. G01C 19/726
356/464
4,567,771 A    2/1986 Nelson et al.
(Continued)

FOREIGN PATENT DOCUMENTS

CH    EP 1083429 A2 *  3/2001 .......... G01P 15/0802
CN    103743390    4/2014
(Continued)

OTHER PUBLICATIONS

US Patent and Trademark Office, "Office Action", "U.S. Appl. No. 14/721,914", Dec. 1, 2016, pp. 1-19, Published in: US.
(Continued)

*Primary Examiner* — Laura Martin
*Assistant Examiner* — Samir M Shah
(74) *Attorney, Agent, or Firm* — Fogg & Powers LLC

(57) ABSTRACT

Systems and methods for a time-based optical pickoff for MEMS sensors are provided. In one embodiment, a method for an integrated waveguide time-based optical-pickoff sensor comprises: launching a light beam generated by a light source into an integrated waveguide optical-pickoff monolithically fabricated within a first substrate, the integrated waveguide optical-pickoff including an optical input port, a coupling port, and an optical output port; and detecting changes in an area of overlap between the coupling port and a moving sensor component separated from the coupling port by a gap by measuring an attenuation of the light beam at the optical output port, wherein the moving sensor component is moving in-plane with respect a surface of the first substrate comprising the coupling port and the coupling port is positioned to detect movement of an edge of the moving sensor component.

19 Claims, 6 Drawing Sheets

(51) Int. Cl.

| | |
|---|---|
| *G01C 19/5621* | (2012.01) |
| *G01C 19/5656* | (2012.01) |
| *G01C 25/00* | (2006.01) |
| *G01P 15/093* | (2006.01) |
| *G01P 21/00* | (2006.01) |
| *G01C 19/574* | (2012.01) |
| *G01P 15/03* | (2006.01) |
| *G02B 6/293* | (2006.01) |
| *G01P 15/08* | (2006.01) |

(52) U.S. Cl.
CPC ........... *G01C 19/574* (2013.01); *G01C 25/00* (2013.01); *G01P 15/032* (2013.01); *G01P 15/093* (2013.01); *G01P 21/00* (2013.01); *G02B 6/29331* (2013.01); *B81B 2201/0228* (2013.01); *B81B 2201/04* (2013.01); *B81B 2203/053* (2013.01); *G01P 2015/0822* (2013.01)

(58) Field of Classification Search
CPC ... G02B 6/3536; G02B 6/3518; G01P 15/032; G01P 3/36; G01P 3/68; G01P 15/093; B81B 2201/04; B81B 7/02
See application file for complete search history.

(56) References Cited

U.S. PATENT DOCUMENTS

| | | | | |
|---|---|---|---|---|
| 4,662,751 | A * | 5/1987 | Goss | G01C 19/726 250/231.12 |
| 4,914,291 | A * | 4/1990 | Kan | G01D 5/30 250/227.29 |
| 4,983,007 | A * | 1/1991 | James | G02B 6/14 250/227.24 |
| 6,377,718 | B1 | 4/2002 | Que et al. | |
| 6,490,391 | B1 * | 12/2002 | Zhao | G02B 6/12007 385/129 |
| 6,571,035 | B1 * | 5/2003 | Pi | G02B 6/12007 385/15 |
| 6,621,952 | B1 * | 9/2003 | Pi | G02B 6/12007 385/140 |
| 6,625,349 | B2 * | 9/2003 | Zhao | G02B 6/12007 385/15 |
| 6,668,111 | B2 * | 12/2003 | Tapalian | G01P 15/093 385/27 |
| 6,718,097 | B2 * | 4/2004 | Dyott | G02B 6/02 385/27 |
| 6,879,751 | B2 | 4/2005 | Deliwala | |
| 7,085,452 | B1 * | 8/2006 | Lin | G01K 11/32 374/E11.015 |
| 7,406,220 | B1 * | 7/2008 | Christensen | G02B 6/032 385/27 |
| 7,486,855 | B2 * | 2/2009 | Smith | G01N 21/7746 385/30 |
| 7,512,298 | B2 * | 3/2009 | Yi | G01N 21/7746 356/337 |
| 7,702,202 | B2 * | 4/2010 | Koch | B82Y 20/00 385/129 |
| 7,840,102 | B2 * | 11/2010 | Boyd | E21B 47/065 385/12 |
| 7,903,240 | B2 * | 3/2011 | Smith | G01N 21/7746 356/337 |
| 7,903,906 | B2 * | 3/2011 | Smith | G01N 21/7746 385/12 |
| 7,933,022 | B2 * | 4/2011 | Smith | G01N 21/7746 356/480 |
| 8,124,927 | B2 * | 2/2012 | Savchenkov | G02B 6/12007 250/227.24 |
| 8,542,365 | B2 | 9/2013 | Pruessner et al. | |
| 8,755,106 | B2 | 6/2014 | Zhang et al. | |
| 9,012,830 | B2 * | 4/2015 | Zhu | G01N 21/7746 250/227.14 |
| 9,069,004 | B2 * | 6/2015 | Bhave | G01P 15/093 |
| 9,395,177 | B2 * | 7/2016 | Pruessner | G01B 11/14 |
| 2002/0044721 | A1 * | 4/2002 | Bjorklund | G02B 6/29361 385/18 |
| 2002/0094168 | A1 * | 7/2002 | Cai | G02B 6/10 385/43 |
| 2004/0223697 | A1 * | 11/2004 | Andersen | H01S 5/026 385/39 |
| 2006/0103851 | A1 | 5/2006 | Nathan et al. | |
| 2006/0133728 | A1 * | 6/2006 | Biyikli | G02B 6/02133 385/37 |
| 2008/0271533 | A1 | 11/2008 | Csutak | |
| 2010/0097682 | A1 * | 4/2010 | Angeley | A61F 9/00821 359/227 |
| 2014/0283601 | A1 | 9/2014 | Bhave et al. | |
| 2014/0363119 | A1 | 12/2014 | Stephens et al. | |
| 2015/0020590 | A1 | 1/2015 | Painter et al. | |
| 2016/0320180 | A1 * | 11/2016 | Lodden | G01C 19/5656 |
| 2016/0334440 | A1 * | 11/2016 | Fertig | G01P 21/00 |
| 2016/0349283 | A1 * | 12/2016 | Bramhavar | G01P 15/097 |

FOREIGN PATENT DOCUMENTS

| | | | |
|---|---|---|---|
| EP | 0527604 | 2/1993 | |
| EP | 1083429 | 3/2001 | |
| WO | 2015088738 | 6/2015 | |
| WO | WO 2015088738 A1 * | 6/2015 | ......... G01C 19/5719 |

OTHER PUBLICATIONS

European Patent Office, "Extended European Search Report—Application No. 16174671.4", "from U.S. Appl. No. 14/860,443", Oct. 28, 2016, pp. 1-14, Published in: EP.

Guldimann et al., "Fiber-Optic Accelerometer With Micro-Optical Shutter Modulation and Integrated Damping", "IEEE/LEOS International Conference on Optical Mems, XP001034987, DOI: 10.1109/OMEM5.2000.879665", Aug. 21, 2000, pp. 141-142.

U.S. Patent and Trademark Office, "Restriction Requirement", "U.S. Appl. No. 14/721,914, filed May 26, 2015", Aug. 25, 2016, pp. 1-6, Published in: US.

"Femtosecond Laser Processing of Miniaturized Optical Systems and Sensors in Glass Substrates", "Retrieved Apr. 28, 2015 from Full Web Address in Notes", 2015, pp. 1-3, Publisher: Fraunhofer Heinrich Hertz Institute.

Jiang et al, "Optical actuation of silicon cantilevers: Modelling and Experimental investigation", "Proceedings of SPIE downloaded from http://proceedings.spiedigitallibrary.org/", May 17, 2013, pp. 1-14, vol. 8763.

Osellame et al., "Femtosecond laser fabrication for the integration of optical sensors in microfluidic lab-on-chip devices", Jul. 23, 2009, pp. 1-3.

Rogers, "Evanescent Wave Coupling Using Different Subwavelength Gratings for a MEMS Accelerometer", Mar. 28, 2011, pp. 1-160, Publisher: University of South Florida Scholar Commons.

Sauter et al., "Making Optical MEMS Sensors more compact using Organic Light Sources and Detectors", "2014 IEEE Emerging Technology and Factory Automation (ETFA)", Sep. 16-19, 2014, pp. 1-4.

Lodden et al., "System and Methods for Highly Integrated Optical Readout MEMS Sensors", "U.S. Appl. No. 14/721,914, filed May 26, 2015", May 26, 2015, pp. 1-33.

European Patent Office, "Extended European Search Report from EP Application No. 161660972 mailed Sep. 16, 2016", "from Foreign Counterpart of U.S. Appl. No. 14/721,914", Sep. 16, 2016, pp. 1-12, Published in: EP.

Burcham et al., "Micromachined Silicon Cantilever Beam Accelerometer Incorporating an Integrated Optical Waveguide", "Integrated Optics and Microstructures (1992)", Sep. 8, 1992, pp. 1-7, vol. 1793, Published in: US.

Culshaw, "Fibre optic sensor: integration with micromachined devices", Mar. 1, 1995, pp. 463-469, vol. 47, No. 1-3, Publisher: Sensors and Actuators A : Elsevier Science S.A.

(56) References Cited

OTHER PUBLICATIONS

Dong et al., "An On-Chip Opto-Mechanical Accelerometer", "Micro Electro Mechanical Systems (MEMS), 2013", Jan. 20, 2013, pp. 641-644, Publisher: IEEE 26th International Conference, Published in: Taipei, Taiwan.

Kalenik et al., "A cantilever optical-fiber accelerometer", Jun. 15, 1998, pp. 350-355, vol. 68, No. 1-3, Publisher: Sensors and Actuators A : Elsevier Science S.A.

US Patent and Trademark Office, "Final Office Action", "U.S. Appl. No. 14/721,914", dated Jun. 5, 2017, pp. 1-17.

US Patent and Trademark Office, "Notice of Allowance", U.S. Appl. No. 14/721,914, dated Sep. 21, 2017, pp. 1-11, Published in: US.

* cited by examiner

SYSTEMS AND METHODS FOR A TIME-BASED OPTICAL PICKOFF FOR MEMS SENSORS

CROSS-REFERENCE TO RELATED APPLICATIONS

This application claims priority to, and the benefit of, U.S. Provisional Application No. 62/185,256 "TIME-BASED OPTICAL PICKOFF FOR MEMS SENSORS" filed on Jun. 26, 2015, which is incorporated herein by reference in its entirety.

This application is related to, U.S. Provisional Application No. 62/154,197 entitled "HIGHLY INTEGRATED OPTICAL READOUT MEMS SENSORS" filed on Apr. 29, 2015; and U.S. patent application Ser. No. 14/721,914 entitled "SYSTEMS AND METHODS FOR HIGHLY INTEGRATED OPTICAL READOUT MEMS SENSORS" filed on May 26, 2015, both of which are incorporated herein by reference in their entirety.

BACKGROUND

The use of capacitive readouts in micro-electromechanical system (MEMS) sensors is susceptible to a variety of error mechanisms such as electrical feed-through, electrical damping of sensor mechanical modes, glass charging, work function changes of metallic capacitive plates, etc. In addition, the scale factor (SF) of the sensor, or the amount of signal you get out divided by the input signal, is directly related to sensitivity of the readout mechanism. These two factors limit the effectiveness of capacitive readout in MEMS sensors. Optical evanescent coupling is a promising readout technique that is potentially more sensitive than its capacitive counterpart and is not vulnerable to the electrostatic error mechanisms mentioned above. However, many of the proposed methods are not rugged enough to handle the harsh environmental factors that sensors are often exposed to. Further, while optical coupling has high sensitivity to measuring the vertical displacement of the silicon features, it is sometimes important or desirable to also measure horizontal motion.

For the reasons stated above and for other reasons stated below which will become apparent to those skilled in the art upon reading and understanding the specification, there is a need in the art for alternate systems and methods of time-based optical pickoffs for MEMS sensors.

SUMMARY

Systems and methods for a time-based optical pickoff for MEMS sensors are provided. In one embodiment, a method for an integrated waveguide time-based optical-pickoff sensor comprises: launching a light beam generated by a light source into an integrated waveguide optical-pickoff monolithically fabricated within a first substrate, the integrated waveguide optical-pickoff including an optical input port, a coupling port, and an optical output port; and detecting changes in an area of overlap between the coupling port and a moving sensor component separated from the coupling port by a gap by measuring an attenuation of the light beam at the optical output port, wherein the moving sensor component is moving in-plane with respect a surface of the first substrate comprising the coupling port and the coupling port is positioned to detect movement of an edge of the moving sensor component.

DRAWINGS

Embodiments of the present invention can be more easily understood and further advantages and uses thereof more readily apparent, when considered in view of the description of the preferred embodiments and the following figures in which.

In accordance with common practice, the various described features are not drawn to scale but are drawn to emphasize features relevant to the present invention. Reference characters denote like elements throughout figures and text.

DETAILED DESCRIPTION

In the following detailed description, reference is made to the accompanying drawings that form a part hereof, and in which is shown by way of specific illustrative embodiments ways in which the invention may be practiced. These embodiments are described in sufficient detail to enable those skilled in the art to practice the invention, and it is to be understood that other embodiments may be utilized and that logical, mechanical and electrical changes may be made without departing from the scope of the present invention. The following detailed description is, therefore, not to be taken in a limiting sense.

Embodiments of the present disclosure provide system and methods for time-based optical pickoffs fabricated within the glass substrate of a MEMS sensor such as, but not limited to a MEMS gyroscope or MEMS accelerometer. Many MEMS sensors are multi-layer structures where one layer consists of a glass substrate that includes integrated waveguides. When a moving MEMS structure is in close enough proximity to such a waveguide, a portion of light traveling through the waveguide can be extracted out via evanescent coupling. The closer the moving structure is to the waveguide, the more light is coupled out of the waveguide. Thus, the amplitude of motion for the moving structure in the MEMS device can be derived by monitoring the light intensity output of the waveguide. More specifically, when a portion of the waveguide is near the surface of the glass substrate, an evanescent field couples out of the waveguide into the surrounding medium (vacuum, air, etc.). The strength of this evanescent field drops off exponentially with distance from the waveguide. When a silicon feature, such as the proof mass of a MEMS gyroscope or accelerometer, comes close to the waveguide the silicon feature will pick up some of the optical power from the evanescent field. This in turn reduces the intensity at the output of the waveguide. Therefore, the intensity is used as a measure of the motion of the silicon feature. As described below, the approaches disclosed herein produce a time-based measurement that is a highly-sensitive function of the motion of the silicon feature. Evanescent coupling is potentially much more sensitive to changes in overlap than capacitive coupling. Embodiments disclosed herein may also be relatively more stable than competing optical readout schemes due to the monolithic integration of the sensing components that can be utilized. The optical pickoff (OP), which may also be described as an evanescent pickoff (EP), has a very high sensitivity to the vertical displacement (the "gap") of the silicon feature (for example, a proof mass) as described in U.S. patent application Ser. No. 14/721,914. Embodiments described herein present time-based optical pickoff systems and methods that can measure horizontal motion (i.e., in-plane motion) of the silicon feature with high accuracy.

Figure 1:
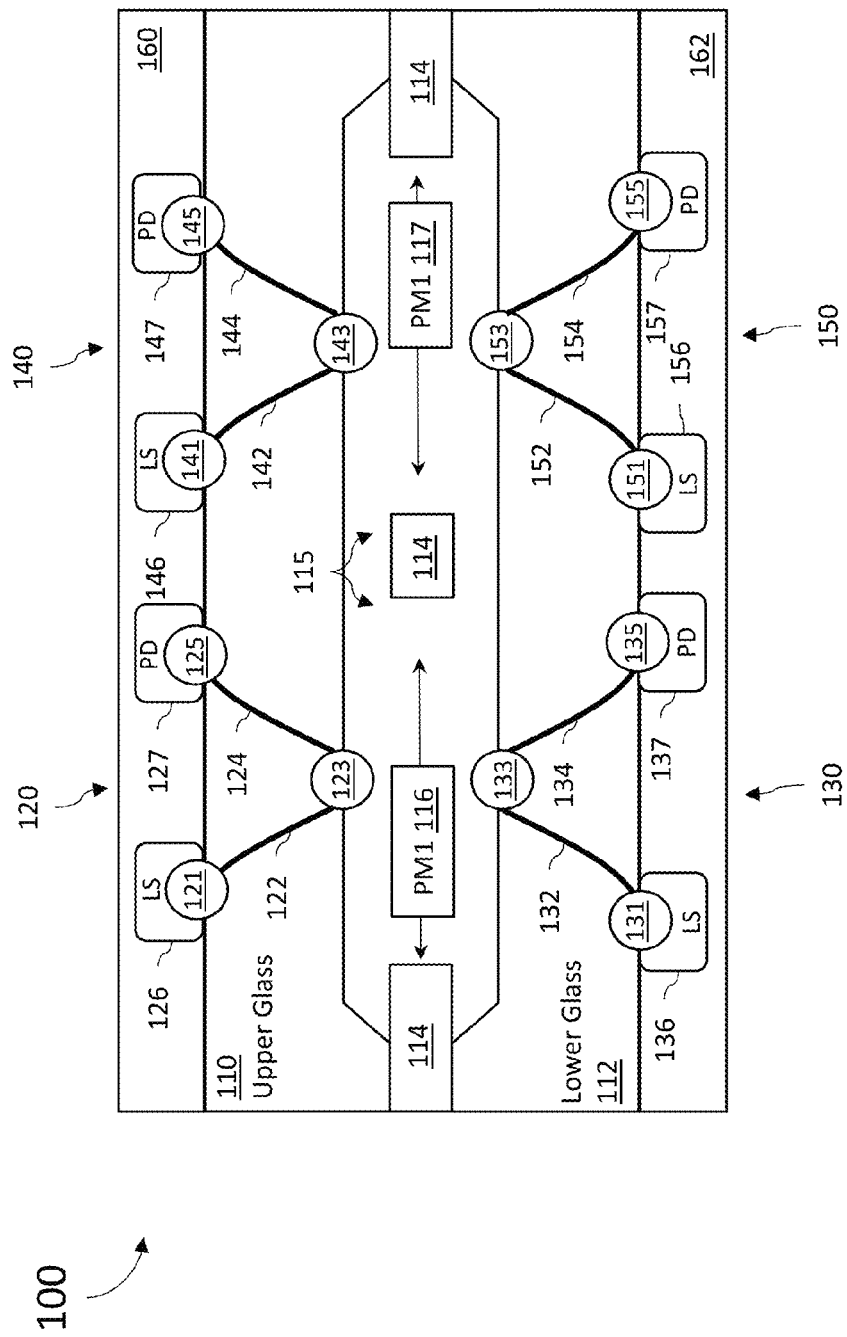
FIG. 1 is a diagram of a monolithic time-based optical pickoff optical readout MEMS sensor of one embodiment of the present disclosure.

With embodiments of the present disclosure, a waveguide optical pickup is positioned near an edge of the moving silicon feature. As the silicon feature moves back and forth in-plane, the amount of overlap between the feature and the waveguide optical pickup changes and the amount of coupling to the waveguide sequentially increases and decreased accordingly. The waveguide may be on the order of a few microns wide, so the positional resolution is only a few microns. However, if the silicon feature is vibrating, it repeatedly couples and uncouples, resulting in a periodically-varying output intensity FIG. 1 is a diagram of one embodiment of the present disclosure of an integrated optical readout MEMS sensor 100 having a pair of silicon proof masses (116 and 117) driven into horizontal (i.e., in-plane) vibration. Sensor 100 comprises a device layer 114 comprising the first proof mass 116 and the second proof mass 117. In one embodiment, device layer 114 is a gyroscope device layer. In other embodiments, device layer 114 is an accelerometer device layer. In this embodiment, the device layer 114 is positioned between an upper glass substrate 110 and a lower glass substrate 112 defining an open space cavity 115 within which the first proof mass 116 and second proof mass 117 each have at least one degree of freedom (1-DOF) to move within the open space cavity 115 in a parallel direction (i.e. in-plane) with respect to the plane of the device layer 114. That is, while the proof masses may move with up to three degrees of freedom, they at least move back and forth in the plane of the gyroscope device layer 114. For example, in addition to being driven into horizontal vibration, these motions may also be in reaction to inertial forces applied along a sensing axis of sensor 100. Motion of proof masses 116 and 117 is measured by the time-based optical-pickoffs 120, 130, 140 and 150 which each comprise integrated waveguide optical pickoffs. As the term is used herein, "integrated waveguide" means that the optical-pickoffs 120, 130, 140 and 150 comprise waveguides monolithically integrated into the glass substrates 110 and 112. In one embodiment, these integrated waveguide elements are created using three dimensional femtosecond laser waveguide patterning into, for example, a Gorilla Glass™, Pyrex™ or Borofloat™ material, from which glass substrates 110 and 112 are fabricated.

As shown in FIG. 1, one or both of integrated waveguide time-based optical-pickoffs 120 and 130 may be used to measure the horizontal in-plane displacement of proof mass 116. Integrated waveguide optical-pickoff 120 may be fabricated within the upper glass substrate 110 over proof mass 116 and comprises an optical input port 121, a coupling port 123 and an optical output port 125. In one embodiment, one or both of optical input port 121 and optical output port 125 may comprise regions of an external surface of upper glass substrate 110 polished to facilitate low-loss entry and exit of light from integrated waveguide optical-pickoff 120. Input port 121 is optically coupled to coupling port 123 by monolithically integrated waveguide 122 while coupling port 123 is further coupled to output port 125 by monolithically integrated waveguide 124. In one embodiment, coupling port 123 comprises a portion of the monolithically integrated waveguide between waveguides 122 and 124 that approaches the surface of upper glass substrate 110 within open space cavity 115 and positioned to couple light into proof mass 116 when proof mass 116 is in close proximity and at least partially overlaps with coupling port 123. In one embodiment, light is launched into upper glass substrate 110 at input port 121 by a light source 126 and measured exiting upper glass substrate 110 at output port 125 by a photodetector 127.

Integrated waveguide optical-pickoff 130 may be fabricated within the lower glass substrate 112 under proof mass 116 and comprises an optical input port 131, a coupling port 133 and an optical output port 135. In one embodiment, one or both of optical input port 131 and optical output port 135 may comprise regions of an external surface of lower glass substrate 112 polished to facilitate low-loss entry and exit of light from integrated waveguide optical-pickoff 130. Input port 131 is optically coupled to coupling port 133 by monolithically integrated waveguide 132 while coupling port 133 is further coupled to output port 135 by monolithically integrated waveguide 134. In one embodiment, coupling port 133 comprises a portion of the monolithically integrated waveguide between waveguides 132 and 134 that approaches the surface of lower glass substrate 112 within open space cavity 115 and positioned to couple light into proof mass 116 when proof mass 116 is in close proximity and at least partially overlaps with coupling port 133. In one embodiment, light is launched into lower glass substrate 112 at input port 131 by a light source 136 and measured exiting lower glass substrate 112 at output port 135 by a photodetector 137.

Also as shown in FIG. 1, one or both of integrated waveguide optical-pickoffs 140 and 150 may be used to measure the displacement of proof mass 117. Integrated waveguide optical-pickoff 140 may be fabricated within the upper glass substrate 110 over proof mass 117 and comprises an optical input port 141, a coupling port 143 and an optical output port 145. In one embodiment, one or both of optical input port 141 and optical output port 145 may comprise regions of an external surface of upper glass substrate 110 polished to facilitate low-loss entry and exit of light from integrated waveguide optical-pickoff 140. Input port 141 is optically coupled to coupling port 143 by monolithically integrated waveguide 142 while coupling port 143 is further coupled to output port 145 by monolithically integrated waveguide 144. In one embodiment, coupling port 143 comprises a portion of the monolithically integrated waveguide between waveguides 142 and 144 that approaches the surface of upper glass substrate 110 within open space cavity 115 and positioned to couple light into proof mass 117 when proof mass 117 is in close proximity and at least partially overlaps with coupling port 143. In one embodiment, light is launched into upper glass substrate 110 at input port 141 by a light source 146 and measured exiting upper glass substrate 110 at output port 145 by a photodetector 147.

Integrated waveguide optical-pickoff 150 may be fabricated within the lower glass substrate 112 under proof mass 117 and comprises an optical input port 151, a coupling port 153 and an optical output port 155. In one embodiment, one or both of optical input port 151 and optical output port 155 may comprise regions of an external surface of lower glass substrate 112 polished to facilitate low-loss entry and exit of light from integrated waveguide optical-pickoff 150. Input port 151 is optically coupled to coupling port 153 by monolithically integrated waveguide 152 while coupling port 153 is further coupled to output port 155 by monolithically integrated waveguide 154. In one embodiment, coupling port 153 comprises a portion of the monolithically integrated waveguide between waveguides 152 and 154 that approaches the surface of lower glass substrate 112 within open space cavity 115 and positioned to couple light into proof mass 117 when proof mass 117 is in close proximity and at least partially overlaps with coupling port 153. In one embodiment, light is launched into lower glass substrate 112 at input port 151 by a light source 156 and measured exiting lower glass substrate 112 at output port 155 by a photodetector 157.

Light sources 126, 136, 146 and 156 and photodetectors 127, 137, 147 and 157 are electrical devices which may be either integrated into the device package housing sensor 100, or alternately may be fabricated within interposer layers 160 and 162 (or other physical layers) that interface with the external upper and lower surfaces of upper glass substrate 110 and lower glass substrate 112, respectively. In one implementation, light sources 126, 136, 146 and 156 are each light emitting diode (LED) light sources. In other implementations, light sources 126, 136, 146 and 157 are laser light sources, such as but not limited to a laser diode.

In operation, proof masses 116 and 117 are driven into horizontal vibration and will oscillate in-plane within the plane of device layer 114 so that edges of the proof masses move back and forth such as to cover and then uncover the respective coupling port(s). Out of plane displacement of the proof masses 116 and 117 may also occur, due to inertial forces, by a distance that is directly proportional to the magnitude of the inertial forces. It should therefore be noted that in-plane motion detection and measurement described herein may be utilized in combination with the vertical (i.e., out-of-plane) displacement measurement techniques described in U.S. patent application Ser. No. 14/721,914.

Figure 2:
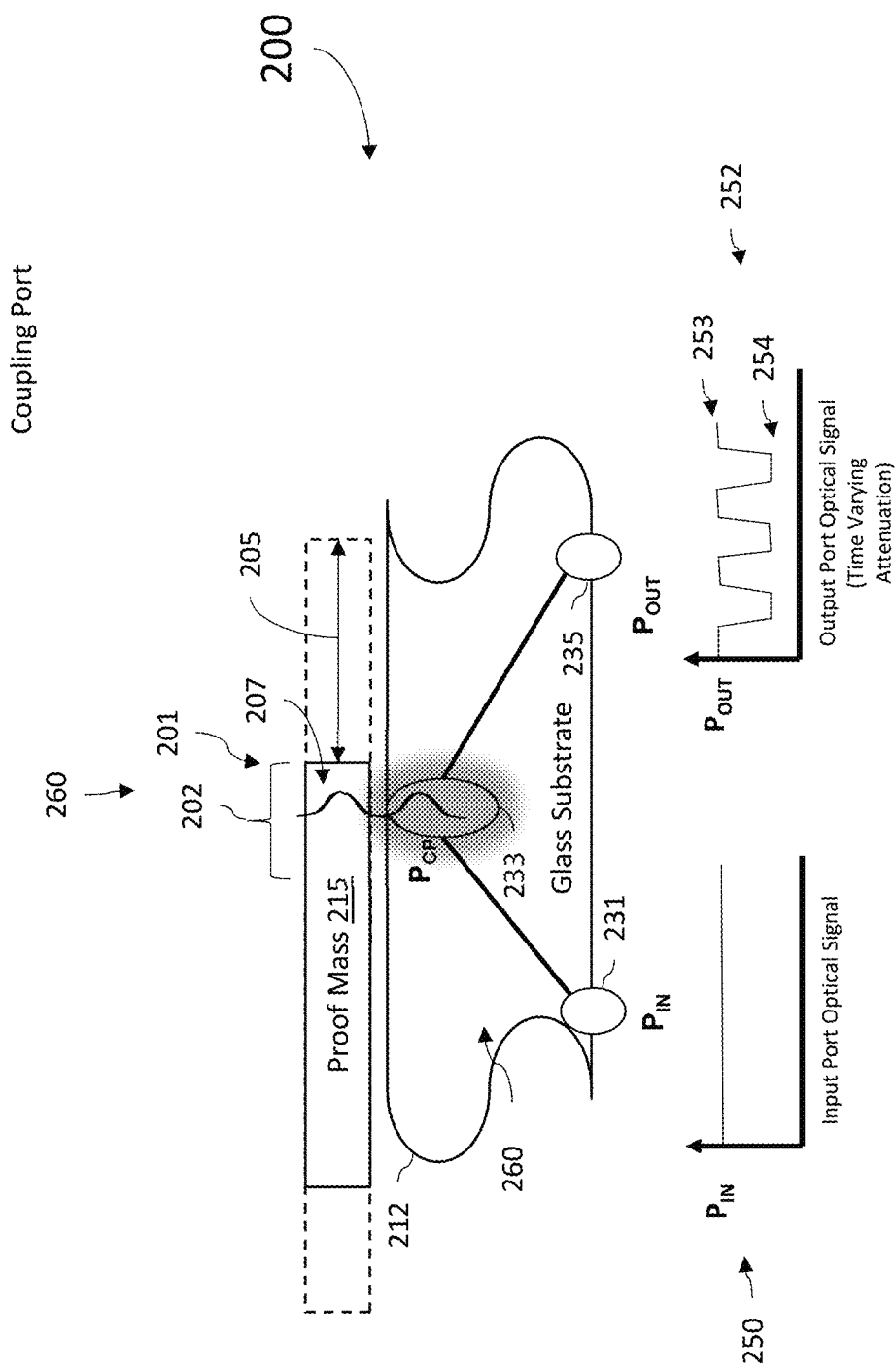
FIGS. 2 and 3 are diagrams illustrating operation of a monolithic time-based optical pickoff optical readout MEMS sensor of one embodiment of the present disclosure.

FIG. 2 illustrates at 200 an example operation of an integrated waveguide time-based optical-pickoff 260, which may represent any of the integrated waveguide time-based optical-pickoffs 120, 130, 140 and 150 discussed above. In the example of FIG. 2, proof mass 215 (which may represent, for example, either proof mass 116 or 117) is deflected in-plane (i.e. horizontally as shown by 205) with respect to coupling port 233 so that the amount of overlap between proof mass 215 and coupling port 233 (shown at 202) varies and the amount of optical coupling between coupling port 233 and proof mass 215 varies accordingly. Here, the integrated waveguide time-based optical-pickoff 260 is monolithically fabricated within a glass substrate 212 and comprises an optical input port 231, a coupling port 233 and an optical output port 235 such as is described in FIG. 1. Due to driving forces, inertial forces, or a combination thereof, an edge 201 of proof mass 215 moves back-and-forth in-plane a distance that is proportional to the magnitude of the force. Movement of that edge 201 is detected at coupling port 233 using optical evanescent coupling. The relative position of edge 201 with respect to coupling port 233 (and therefore the resulting area of overlap) is determined as a function of optical coupling between proof mass 215 and coupling port 233. In other words, the coupling port 233 is positioned relative to the edge 201 of the moving sensor component 215 such that an area of overlap 202 between the coupling port 233 and the moving sensor component 215 changes with in-plane motion of the moving sensor component 215.

In FIG. 2, graph 250 illustrates the input optical power ($P_{IN}$) of a light beam entering into input port 231 while graph 252 illustrates the output optical power ($P_{OUT}$) of that light beam exiting from output port 235. In-plane movement of edge 201 that decreases the area overlap 202 decreases the optical coupling (illustrated at 207) between proof mass 215 and coupling port 233 so that when overlap 202 is at a minimum (that is, minimally overlapping with coupling port 233 or leaving it completely uncovered), the light intensity $P_{IN}$ launched into input port 231 reaches output port 235 with little to no attenuation (illustrated at 253). In contrast, when overlap 202 is at a maximum (that is, edge 201 moves so that proof mass 214 is mostly or entirely covering coupling port 233), the light intensity $P_{IN}$ launched into input port 231 reaches output port 235 significantly attenuated because at least some portion of light of intensity $P_{IN}$ launched into input port 231 is coupled into proof mass 215 (shown at 207) and does not reach output port 235. The result is an attenuation in the intensity of the light that reaches output port 235 (illustrated at 254). Horizontal oscillation of proof mass 215 results in a corresponding oscillation of optical intensity in the light reaching output port 235, as shown at 252. The frequency or periodicity of displacement can be measured from the output of time-based optical-pickoff 260 by measuring the frequency or periodicity of light exiting output port 235. Furthermore, the amplitude of the lateral or in-plane displacement of the proof mass 215 can be determined from the ratio of the time that the output intensity is low (254) to the time that the intensity is high (253). In this way, utilization of integrated waveguide time-based optical-pickoffs fabricated within the material of the upper and lower glass substrates of a MEMS sensor provide readout stability comparable to or better than that provided by capacitive pickoffs but with the improved sensitivity that can be achieved with optical pickoffs while avoiding stability errors that might otherwise be introduced from incorporating different optical materials to realize the optical pickoffs.

Figure 3:
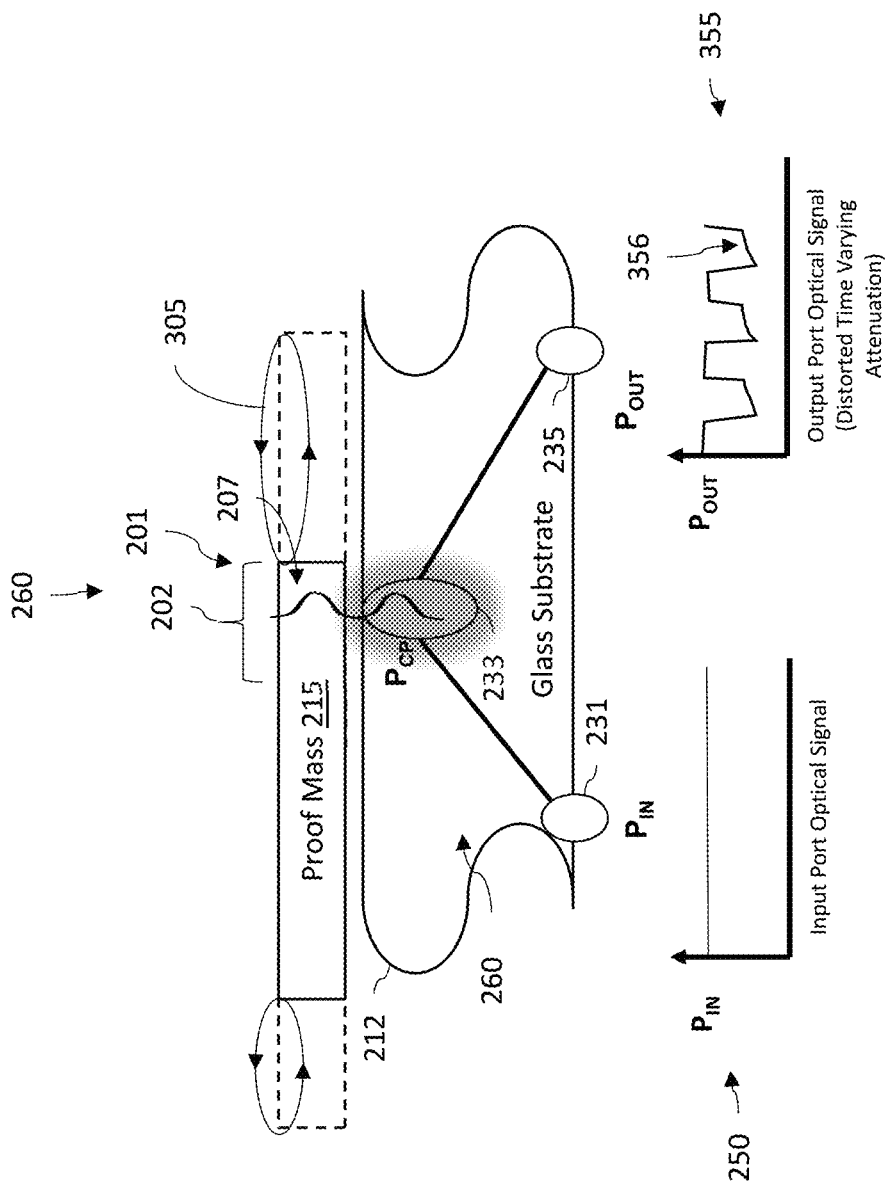

FIG. 3 is a diagram illustrating integrated operation of waveguide optical-pickoff 260 where elliptical motion (shown at 305) is present at edge 201 rather than just simple horizontal motion. That is, the actual motion of proof mass 215 comprises some combination of horizontal (in-plane) and vertical (out-of-plane) motion components. The combination of in-plane and out-of-plane motion components will be manifested by characteristics within the optical signal exiting from output port 235, appearing as a deviation, tick, or anomaly in the waveform as shown at 356 on plot 355 in FIG. 3. The presence of such a characteristic can be used to identify that the elliptical motion 305 of proof mass 215 is occurring. These indications may also be utilized to compensate sensor measurements to account for errors caused by the motion, or the timing of a point on that plot to still get a high-precision measurement.

Figure 4:
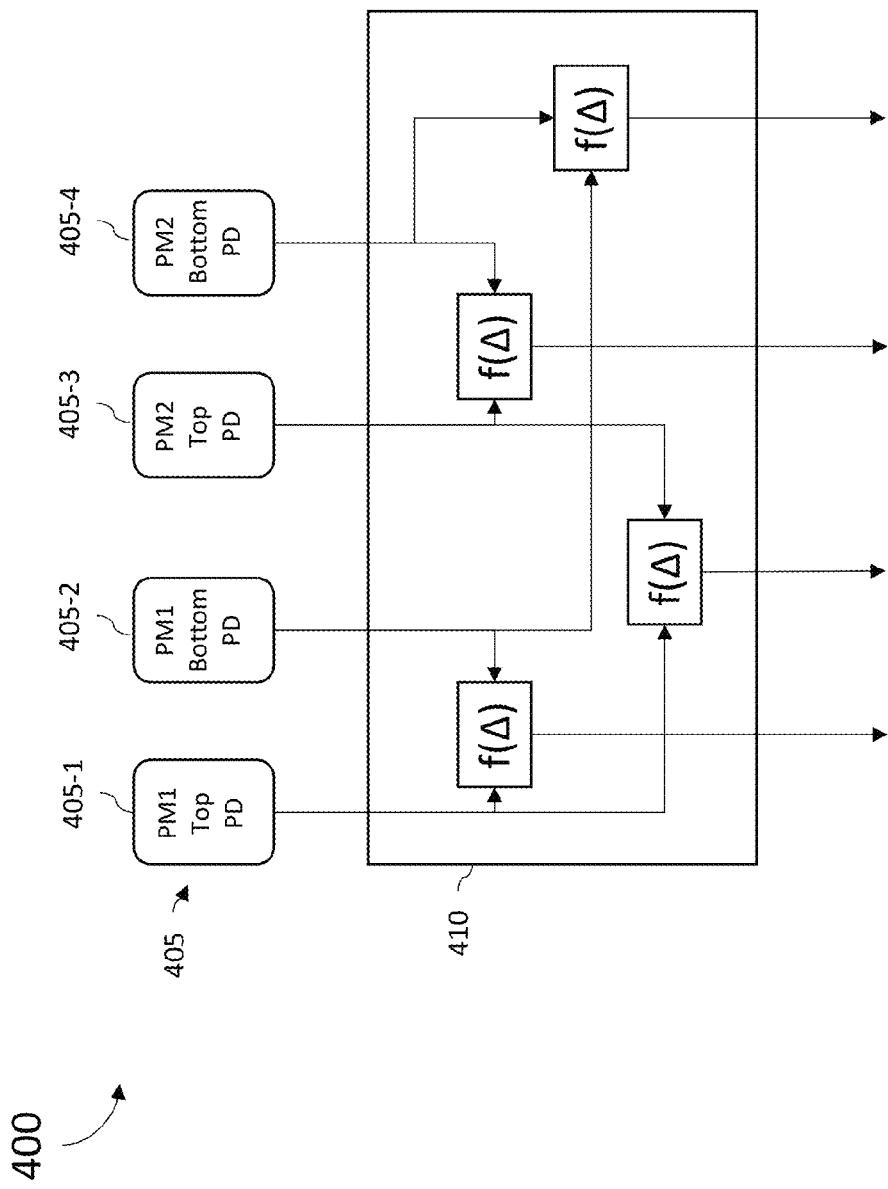
FIG. 4 is a diagram illustrating optical pickoff signal processing of one embodiment of the present disclosure.

FIG. 4 is a diagram illustrating generally at 400 time-based optical pickoff signal processing of one embodiment of the present disclosure which may be implemented by incorporating, or in combination with, any of the time-based optical pickoff embodiments described in this disclosure. For any of the embodiments described herein, the electrical output of the photodetectors (shown generally at 405) associated with each of the integrated waveguide time-based optical-pickoffs may be processed by electronics 410 using either analog or digital means, or a combination thereof, to cancel out common mode or other errors. For example, electronics 410 may determine horizontal and/or vertical displacement of a first proof mass based on a function of the difference between outputs from the two photodetectors (shown at 405-1 and 405-2) measuring displacement from opposing sides of the first proof mass. Similarly, electronics 410 may determine displacement of a second proof mass based on a function of the difference between outputs from the two photodetectors (shown at 405-3 and 405-4) measuring displacement from opposing sides of the second proof mass. Other sensor measurements may be achieved by considering combined deflections of both proof masses. For example, electronics 410 may determine an inertial measurement or correction factor based on a function of the difference between outputs from a top substrate photodetector for the first proof mass (401-1) and a bottom substrate photodetector for the second proof mass (405-4). Similarly, electronics 410 may determine an inertial measurement or correction factor based on a function of the difference between outputs from a bottom substrate photodetector for the first proof mass (405-2) and a top substrate photodetector for the second proof mass (405-3).

Figure 5:
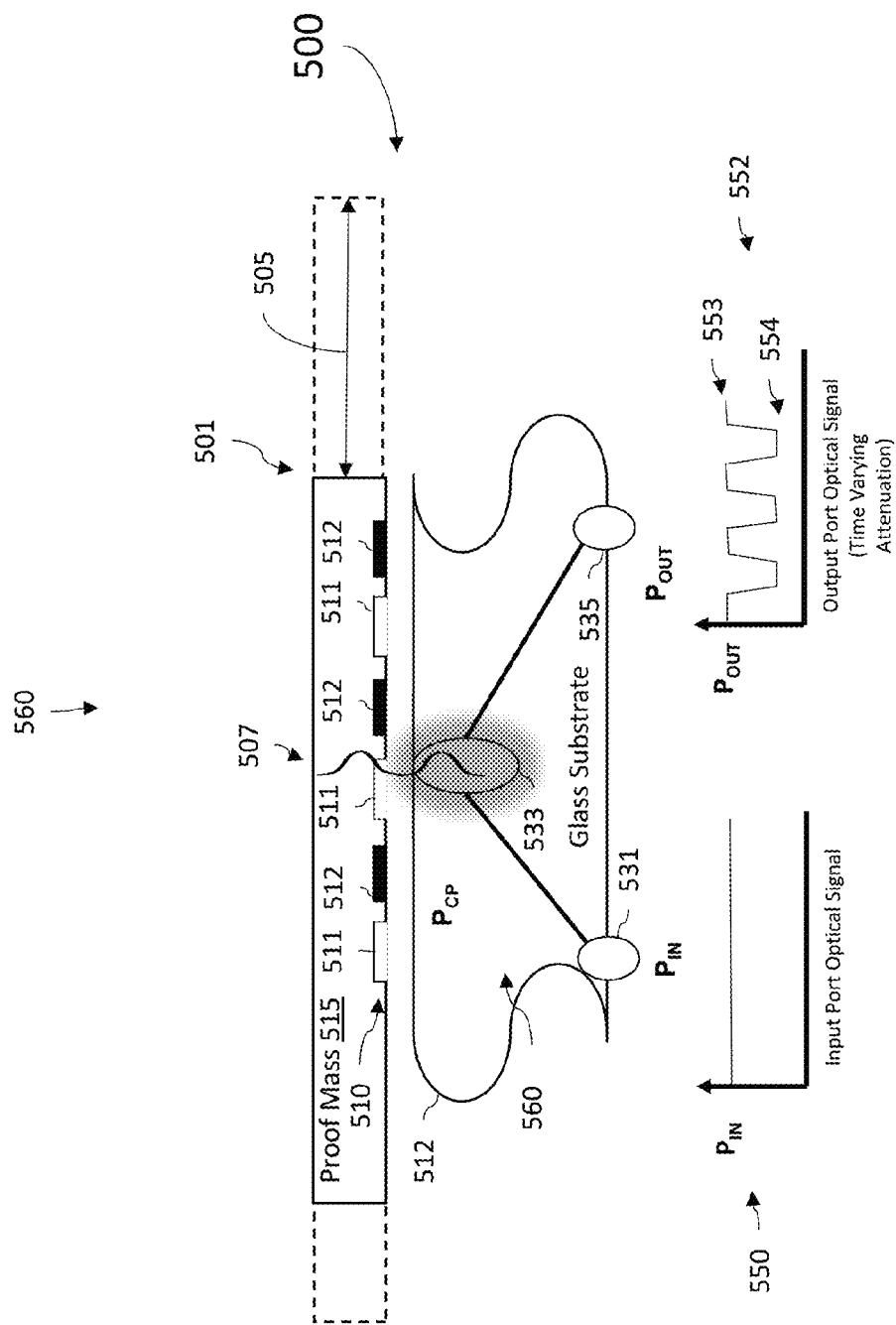
FIG. 5 is a diagram illustrating another optical pickoff drift sensor of one embodiment of the present disclosure.

FIG. 5 illustrates at 500 an example operation of another integrated waveguide time-based optical-pickoff 560, which may represent any of the integrated waveguide time-based optical-pickoffs 120, 130, 140 and 150 discussed above. The integrated waveguide time-based optical-pickoff 560 is monolithically fabricated within a glass substrate 512 and comprises an optical input port 531, a coupling port 533 and an optical output port 535 such as is described in FIG. 1. In the example of FIG. 5, proof mass 515 (which may represent, for example, either proof mass 116 or 117) may be deflected in-plane (i.e. horizontally as shown by 505) with respect to coupling port 533 by either driving or inertial forces. Here, as opposed to pickoff 560 generating an oscillating signal output from pickoff 560 from the back-and-forth motion of edge 501 of proof mass 515 over the coupling port 533, the moving silicon sensor component (proof mass 515) comprises surface features 510 that alters the amount of optical evanescent coupling between coupling port 533 and proof mass 515 as the latter moves in-plane relative to port 533.

For example, in one embodiment, the surface features 510 may comprise a pattern of narrow, shallow grooves in the surface as shown at 511. Alternatively, the surface pattern 510 may a grid or other pattern of narrow, closely spaced metal lines as shown at 512. In some embodiments, the surface features 510 may comprise a combination of lines 512 and grooves 511, or include other patterns of elements with varying evanescent coupling properties. As the surface features 510 pass over coupling port 533, they would alter the evanescent coupling resulting in a modulation of the output intensity of the light from output port 535 similar to how the edge 501 modulates the intensity as described above in FIG. 2.

That is, due to driving forces, inertial forces, or a combination thereof, surface features 510 move back-and-forth in-plane and movement of proof mass 515 altering the amount of evanescent coupling 507, which is detected at coupling port 533 based on movement of the surface features 510. In FIG. 5, graph 550 illustrates the input optical power ($P_{IN}$) of a light beam entering into input port 531 while graph 552 illustrates the output optical power ($P_{OUT}$) of that light beam exiting from output port 535. In-plane movement of the surface features 510 modulates the light beam resulting in oscillation of optical intensity in the light reaching output port 535, as shown at 552. The frequency or periodicity of displacement can be measured from the output of time-based optical-pickoff 560 by measuring the frequency or periodicity of light exiting output port 535. Furthermore, the amplitude of the lateral or in-plane displacement of the proof mass 515 can be determined from the ratio of the time that the output intensity is low (554) to the time that the intensity is high (553).

Figure 6:
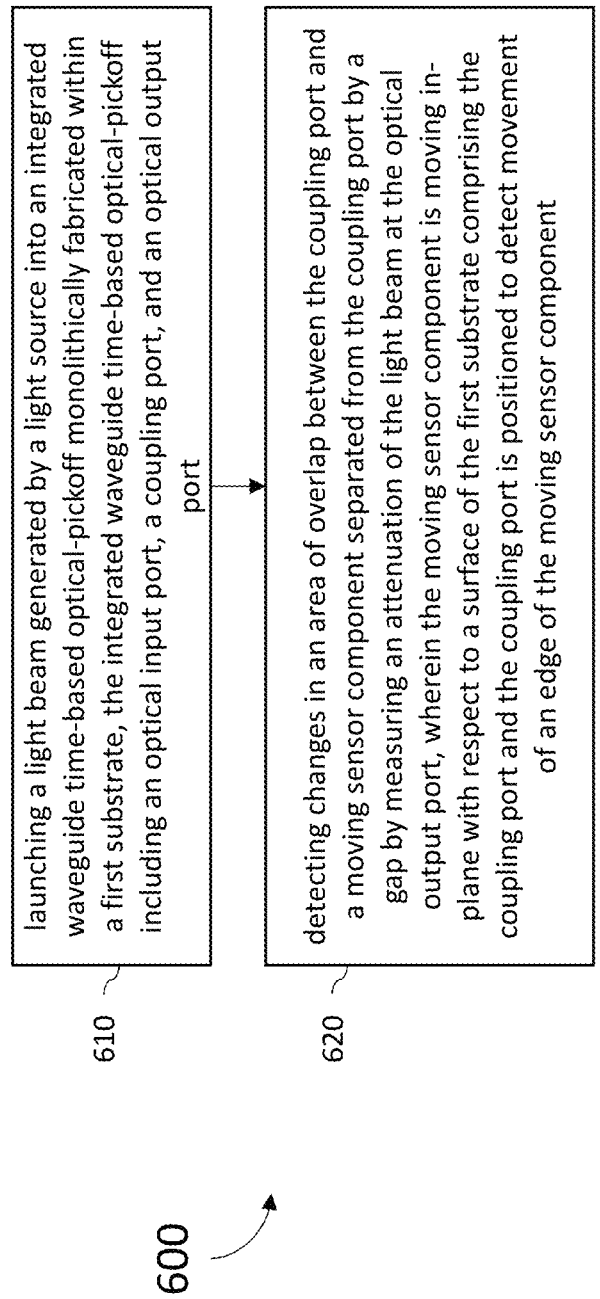
FIG. 6 is a flow chart illustrating a method of one embodiment of the present disclosure.

FIG. 6 is a flow chart illustrating a method 600 of one embodiment of the present disclosure. The method of 600 may be implemented using one or more elements of the various preceding embodiments described herein and may be used in conjunction with, or in combination with, any of the embodiments described with respect to FIGS. 1-5. As such, the disclosures provided above with respect to like named elements above apply the method 600 and vise versa.

The method begins at 610 with launching a light beam generated by a light source into an integrated waveguide time-based optical-pickoff monolithically fabricated within a first substrate, the integrated waveguide optical-pickoff including an optical input port, a coupling port, and an optical output port. In various embodiments, the light source may be implemented using an LED light source, or a laser light source, such as a laser diode. As the term is used herein, "integrated waveguide" means that the optical-pickoffs comprises one or more waveguides monolithically integrated into the first substrate, which may comprise a glass substrate. In one embodiment, these integrated waveguide elements are created using three dimensional femtosecond laser waveguide patterning into, for example, a Gorilla Glass™, Pyrex™ or Borofloat™ material from which the first substrate is fabricated. The light source may be implemented with a light-emitting diode, and may be fabricated within an interposer layer adjacent to the first substrate.

The method proceeds to 620 with detecting changes in an area of overlap between the coupling port and a moving sensor component separated from the coupling port by a gap by measuring an attenuation of the light beam at the optical output port, wherein the moving sensor component is moving in-plane with respect to a surface of the first substrate comprising the coupling port and the coupling port is positioned to detect movement of an edge of the moving sensor component. In one embodiment, the sensor component is a moving sensor component such as a proof mass of an inertial sensor (such as any of the proof masses described above) which may form part of a gyroscope device layer or an accelerometer device layer. The moving sensor component may be positioned within an open space cavity at least partially provided in the first substrate within which the first proof mass may have at least one degree of freedom of movement in reaction to inertial forces applied along the sensing axis of the sensor. Motion of the sensor component is measured by the integrated waveguide time-based optical-pickoff by sensing the amount of light coupled from the coupling port to the sensor component due to the overlap between the coupling port and the sensor component. Changes in the attenuation of light received at the optical output port are indications of changes in the area of overlap between the moving sensor component and the coupling port, which may be converted to an electrical signal (for example, via a photodetector) and processed as described above to generate an inertial measurement. As such, in some embodiments, the method also includes driving the moving sensor component into in-plane vibration such that an edge of the moving sensor component moves back and forth in an oscillating manner covering and uncovering the coupling port. The oscillating optical output produce by motion of the moving sensor component may be used to detect in-plane displacement and/or vibration frequencies (for example, where the moving sensor component is a proof mass for a MEMS sensor) and/or any components of out-of-plane displacement as discussed above.

EXAMPLE EMBODIMENTS

Example 1 includes a method for an integrated waveguide time-based optical-pickoff sensor, the method comprising: launching a light beam generated by a light source into an integrated waveguide optical-pickoff monolithically fabricated within a first substrate, the integrated waveguide optical-pickoff including an optical input port, a coupling port, and an optical output port; and detecting changes in an area of overlap between the coupling port and a moving sensor component separated from the coupling port by a gap by measuring an attenuation of the light beam at the optical output port, wherein the moving sensor component is moving in-plane with respect a surface of the first substrate comprising the coupling port and the coupling port is positioned to detect movement of an edge of the moving sensor component.

Example 2 includes the method of example 1, further comprising: driving the moving sensor component into in-plane vibration such that an edge of the moving sensor component moves back and forth in an oscillating manner covering and uncovering the coupling port.

Example 3 includes the method of any of examples 1-2, further comprising: measuring a timing of an oscillating optical output from the optical output port.

Example 4 includes the method of example 3, further comprising: measuring an in-plane displacement of the moving sensor component based on the oscillating optical output.

Example 5 includes the method of any of examples 1-4, further comprising: determining an amount of overlap between the sensor component and the coupling port based on the attenuation of the light beam at the optical output port.

Example 6 includes the method of any of examples 1-5, wherein the moving sensor component is a micro-electromechanical system (MEMS) inertial sensor proof mass.

Example 7 includes the method of any of examples 1-7, wherein the light source is fabricated within an interposer layer adjacent to the first substrate.

Example 8 includes the method of any of examples 1-7, wherein the light source is a light-emitting diode (LED).

Example 9 includes the method of any of examples 1-7, wherein the light source is a laser light source.

Example 10 includes an integrated optical read out sensor, the sensor comprising: at least a first glass substrate; an integrated waveguide optical-pickoff monolithically fabricated within the first glass substrate and comprising an optical input port, a coupling port, and an optical output port; a moving sensor component adjacent to the coupling port and having a degree-of-freedom of in-plane motion with respect to the coupling port of the integrated waveguide, wherein the coupling port is positioned relative to an edge of the moving sensor component such that an area of overlap between the coupling port and the moving sensor component changes with in-plane motion of the moving sensor component; a light source that launches light into the first glass substrate via the optical input port, wherein a portion of the light couples from the coupling port to the moving sensor component as a function of the area of overlap between the coupling port and the moving sensor component; at least one photodetector coupled to the optical output port; and electronics coupled to the at least one photodetector that calculates a measurement based on an attenuation of optical intensity of the light exiting from the optical output port, wherein the attenuation is at least in part a function of the area of overlap.

Example 11 includes the sensor of example 10, wherein the electronics measures a timing of an oscillating optical output from the optical output port to detecting an amount of coupling of the light from the coupling port to the moving sensor component.

Example 12 includes the sensor of example 11, wherein the electronics calculates an in-plane displacement of the moving sensor component based on the oscillating optical output.

Example 13 includes the sensor of any of examples 10-12, wherein the electronics calculates an amount of overlap between the sensor component and the coupling port based on the attenuation of the light beam at the optical output port.

Example 14 includes the sensor of any of examples 10-13, wherein the moving sensor component is a micro-electromechanical system (MEMS) inertial sensor proof mass.

Example 15 includes the sensor of any of examples 10-14, wherein the moving sensor component is a micro-electromechanical system (MEMS) gyroscope inertial sensor proof mass.

Example 16 includes the sensor of any of examples 10-15, wherein the moving sensor component is a micro-electromechanical system (MEMS) accelerometer inertial sensor proof mass.

Example 17 includes the sensor of any of examples 10-16, wherein the light source is fabricated within an interposer layer adjacent to the first substrate Example 18 includes the sensor of any of examples 10-17, wherein the light source is a light-emitting diode (LED).

Example 19 includes the sensor of any of examples 10-17, wherein the light source is a laser light source.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

We claim:

1. A method for an integrated waveguide time-based optical-pickoff sensor, the method comprising:
    launching a light beam generated by a light source into an integrated waveguide evanescent optical-pickoff monolithically fabricated within a first substrate, the integrated waveguide evanescent optical-pickoff including an optical input port, a coupling port coupled to the optical input port by a first waveguide, and an optical output port coupled to the coupling port by a second waveguide; and
    detecting changes, in an area of overlap between the coupling port and a moving sensor component separated from the coupling port by a gap, by measuring a modulation of the light beam at the optical output port, wherein the moving sensor component is moving in-plane with respect to a surface of the first substrate comprising the coupling port, and the coupling port is positioned to detect movement of an edge of the moving sensor component;
    wherein the coupling port is located within the first substrate and comprises a portion of the monolithically fabricated integrated waveguide that approaches a surface of the first substrate adjacent to the moving sensor component.

2. The method of claim 1, further comprising:
driving the moving sensor component into in-plane vibration such that the edge of the moving sensor component moves back and forth in an oscillating manner covering and uncovering the coupling port.

3. The method of claim 1, further comprising:
measuring a timing of an oscillating optical output from the optical output port.

4. The method of claim 3, further comprising:
measuring an in-plane displacement of the moving sensor component based on the oscillating optical output.

5. The method of claim 1, further comprising:
determining an amount of overlap between the sensor component and the coupling port based on the modulation of the light beam at the optical output port.

6. The method of claim 1, wherein the moving sensor component is a micro-electromechanical system (MEMS) inertial sensor proof mass.

7. The method of claim 1, wherein the light source is fabricated within an interposer layer adjacent to the first substrate.

8. The method of claim 1, wherein the light source is a light-emitting diode (LED).

9. The method of claim 1, wherein the light source is a laser light source.

10. An integrated optical read out sensor, the sensor comprising:
at least a first glass substrate;
an integrated waveguide evanescent optical-pickoff monolithically fabricated within the first glass substrate and comprising an optical input port, a coupling port coupled to the optical input port by a first waveguide, and an optical output port coupled to the coupling port by a second waveguide;
a moving sensor component adjacent to the coupling port and having a degree-of-freedom of in-plane motion with respect to the coupling port of the integrated waveguide evanescent optical-pickoff, wherein the coupling port is positioned relative to an edge of the moving sensor component such that an area of overlap between the coupling port and the moving sensor component changes with the in-plane motion of the moving sensor component, wherein the coupling port is located within the first glass substrate and comprises a portion of the monolithically fabricated integrated waveguide that approaches a surface of the first substrate adjacent to the moving sensor component;
a light source that launches light into the first glass substrate via the optical input port, wherein a portion of the light couples from the coupling port to the moving sensor component as a function of the area of overlap between the coupling port and the moving sensor component;
at least one photodetector coupled to the optical output port; and
electronics, coupled to the at least one photodetector, that calculate a measurement based on a modulation of the light exiting from the optical output port, wherein the modulation is at least in part a function of the area of overlap between the coupling port and the moving sensor component.

11. The sensor of claim 10, wherein the electronics measure a timing of an oscillating optical output from the optical output port to detect an amount of coupling of the light from the coupling port to the moving sensor component.

12. The sensor of claim 11, wherein the electronics calculate an in-plane displacement of the moving sensor component based on the oscillating optical output.

13. The sensor of claim 10, wherein the electronics calculate an amount of overlap between the moving sensor component and the coupling port based on the modulation of the light existing from the optical output port.

14. The sensor of claim 10, wherein the moving sensor component is a micro-electromechanical system (MEMS) inertial sensor proof mass.

15. The sensor of claim 10, wherein the moving sensor component is a micro-electromechanical system (MEMS) gyroscope inertial sensor proof mass.

16. The sensor of claim 10, wherein the moving sensor component is a micro-electromechanical system (MEMS) accelerometer inertial sensor proof mass.

17. The sensor of claim 10, wherein the light source is fabricated within an interposer layer adjacent to the first glass substrate.

18. The sensor of claim 10, wherein the light source is a light-emitting diode (LED).

19. The sensor of claim 10, wherein the light source is a laser light source.

* * * * *

UNITED STATES PATENT AND TRADEMARK OFFICE
CERTIFICATE OF CORRECTION

PATENT NO. : 9,803,979 B2
APPLICATION NO. : 14/860443
DATED : October 31, 2017
INVENTOR(S) : Horning et al.

Page 1 of 1

It is certified that error appears in the above-identified patent and that said Letters Patent is hereby corrected as shown below:

In the Claims

At Column 12, Line 1, please replace "first sub-" with --first glass sub- --

Signed and Sealed this
Twenty-eighth Day of May, 2019

Andrei Iancu
*Director of the United States Patent and Trademark Office*